United States Patent
You et al.

(10) Patent No.: US 9,768,169 B2
(45) Date of Patent: Sep. 19, 2017

(54) SEMICONDUCTOR DEVICES AND FABRICATING METHODS THEREOF

(71) Applicant: Samsung Electronics Co., Ltd., Suwon-Si, Gyeonggi-do (KR)

(72) Inventors: Jung-Gun You, Ansan-si (KR); Sug-Hyun Sung, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 2 days.

(21) Appl. No.: 14/976,082

(22) Filed: Dec. 21, 2015

(65) Prior Publication Data

US 2016/0190131 A1    Jun. 30, 2016

Related U.S. Application Data

(60) Provisional application No. 62/104,478, filed on Jan. 16, 2015.

(30) Foreign Application Priority Data

Dec. 30, 2014  (KR) .................. 10-2014-0194004

(51) Int. Cl.
  *H01L 21/8238* (2006.01)
  *H01L 27/088* (2006.01)
  *H01L 29/06* (2006.01)
  *H01L 21/8234* (2006.01)

(52) U.S. Cl.
  CPC .. *H01L 27/0886* (2013.01); *H01L 21/823431* (2013.01); *H01L 21/823481* (2013.01); *H01L 29/0649* (2013.01); *H01L 29/0657* (2013.01)

(58) Field of Classification Search
  CPC ................ H01L 21/823821; H01L 21/823431
  See application file for complete search history.

(56) References Cited

U.S. PATENT DOCUMENTS

| | | | |
|---|---|---|---|
| 7,074,662 B2 | 7/2006 | Lee et al. | |
| 7,695,665 B2 | 4/2010 | Zadesky et al. | |
| 7,879,677 B2 | 2/2011 | Lee | |
| 8,561,003 B2 | 10/2013 | Kawa et al. | |
| 8,595,661 B2 | 11/2013 | Kawa et al. | |
| 8,835,268 B2 | 9/2014 | Sudo | |
| 2008/0283910 A1* | 11/2008 | Dreeskornfeld | .. H01L 21/82343 257/332 |
| 2009/0283829 A1 | 11/2009 | Dyer et al. | |
| 2013/0292777 A1 | 11/2013 | Liaw | |
| 2014/0091362 A1 | 4/2014 | Chang et al. | |
| 2014/0134814 A1 | 5/2014 | Wong et al. | |
| 2014/0191318 A1 | 7/2014 | Lin et al. | |
| 2014/0197458 A1 | 7/2014 | Ching et al. | |
| 2014/0203338 A1 | 7/2014 | Kelly et al. | |
| 2014/0206156 A1 | 7/2014 | Liu et al. | |
| 2014/0231924 A1 | 8/2014 | Kuo et al. | |

(Continued)

*Primary Examiner* — Peniel M Gumedzoe
*Assistant Examiner* — Christopher Johnson
(74) *Attorney, Agent, or Firm* — Ward and Smith, P.A.

(57) ABSTRACT

Provided is a semiconductor device and a fabricating method thereof. The semiconductor device includes a first trench having a first depth to define a fin, a second trench formed directly adjacent the first trench having a second depth that is greater than the first depth, a field insulation layer filling a portion of the first trench and a portion of the second trench, and a protrusion structure protruding from a bottom of the first trench and being lower than a surface of the field insulation layer.

17 Claims, 17 Drawing Sheets

(56) References Cited

U.S. PATENT DOCUMENTS

| | | |
|---|---|---|
| 2014/0239398 A1 | 8/2014 | Cheng et al. |
| 2014/0248751 A1 | 9/2014 | Cheng et al. |
| 2014/0252413 A1 | 9/2014 | Utomo et al. |
| 2014/0264575 A1 | 9/2014 | Tsai et al. |
| 2014/0264594 A1 | 9/2014 | Adam et al. |
| 2014/0264600 A1 | 9/2014 | Adam et al. |
| 2014/0295647 A1 | 10/2014 | Cheng et al. |
| 2014/0306272 A1 | 10/2014 | Kuo et al. |
| 2014/0312388 A1 | 10/2014 | Colinge |
| 2016/0211262 A1* | 7/2016 | Jan .................... H01L 21/82382 |

* cited by examiner

SEMICONDUCTOR DEVICES AND FABRICATING METHODS THEREOF

CROSS-REFERENCE TO RELATED APPLICATIONS

This application claims priority from Korean Patent Application No. 10-2014-0194004 filed on Dec. 30, 2014 in the Korean Intellectual Property Office and U.S. provisional application No. 62/104,478 filed on Jan. 16, 2015 in the USPTO, and all the benefits accruing therefrom under 35 U.S.C. 119, the contents of which in its entirety are herein incorporated by reference.

BACKGROUND

As one scaling technique for increasing the density of integrated circuit devices, a multi-gate transistor has been proposed, in which a fin- or nanowire-shaped silicon body is formed on a substrate and a gate is then formed on a surface of the silicon body.

Since the multi-gate transistor uses a three-dimensional (3D) channel, scaling of the multi-gate transistor is easily achieved. In addition, current controlling capability can be improved even without increasing a gate length of the multi-gate transistor. Further, a short channel effect (SCE), in which an electric potential of a channel region is affected by a drain voltage, can be effectively suppressed.

SUMMARY

The present inventive concept provides semiconductor devices, which can minimize a development burden.

The present inventive concept also provides fabricating methods of a semiconductor device, which can minimize a development burden.

These and other objects of the present inventive concept will be described in or be apparent from the following description of some embodiments thereof.

According to some embodiments of the present inventive concept, there is provided a semiconductor device including a first trench having a first depth to define a fin, a second trench formed directly adjacent the first trench having a second depth greater than the first depth, a field insulation layer filling a portion of the first trench and a portion of the second trench, and a protrusion structure protruding from a bottom of the first trench and being lower than a surface of the field insulation layer.

In some embodiments, there is provided a semiconductor device including a first trench having a first depth to define a first active region and a second active region separated from each other, a second trench defining a first fin in the first active region and having a second depth smaller than the first depth, a third trench defining a second fin in the second active region and having a third depth smaller than the first depth, a field insulation layer filling a portion of the first trench, a portion of the second trench and a portion of the third trench, and a first protrusion structure protruding from a bottom of the second trench and being lower than a surface of the field insulation layer.

According to some embodiments of the present inventive concept, there is provided a semiconductor device including a protrusion structure that has a first inclined surface and a second inclined surface, a first trench connected to the first inclined surface and defining a fin, and a second trench connected to the second inclined surface, wherein an inclination angle of a sidewall the second trench is equal to an inclination angle of the second inclined surface, and a height of the protrusion structure is smaller than a height of the fin.

According to some embodiments of the present inventive concept, there are provided fabricating methods of a semiconductor device including forming a plurality of fins by forming a plurality of first trenches having a first depth, defining an active region by forming a second trench having a second depth greater than the first depth, the first trench and the second trench partially overlapping each other so that a protrusion structure is formed at a boundary between the first trench and the second trench, and forming a field insulation layer filling a portion of the first trench and a portion of the second trench.

BRIEF DESCRIPTION OF THE DRAWINGS

The above and other features and advantages of the present inventive concept will become more apparent by describing in detail some embodiments thereof with reference to the attached drawings in which.

DETAILED DESCRIPTION OF THE EMBODIMENTS

Figure 1:
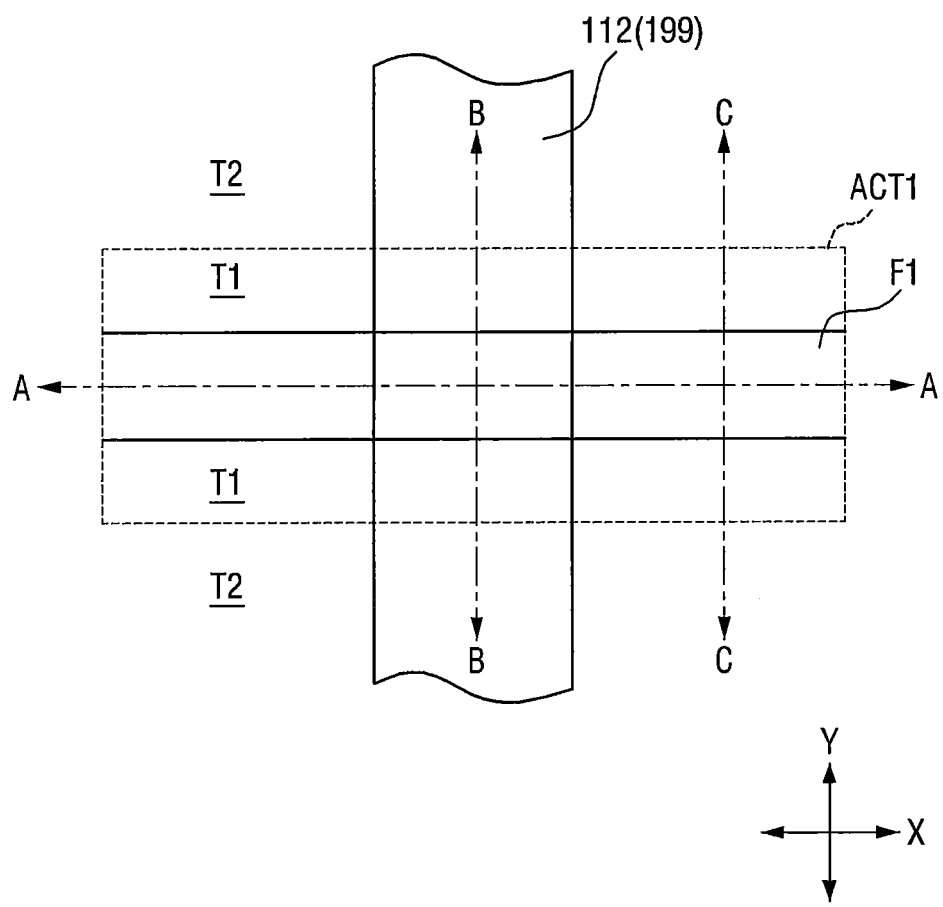
FIG. 1 is a layout view illustrating a semiconductor device according to a first embodiment of the present inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

Figure 2:
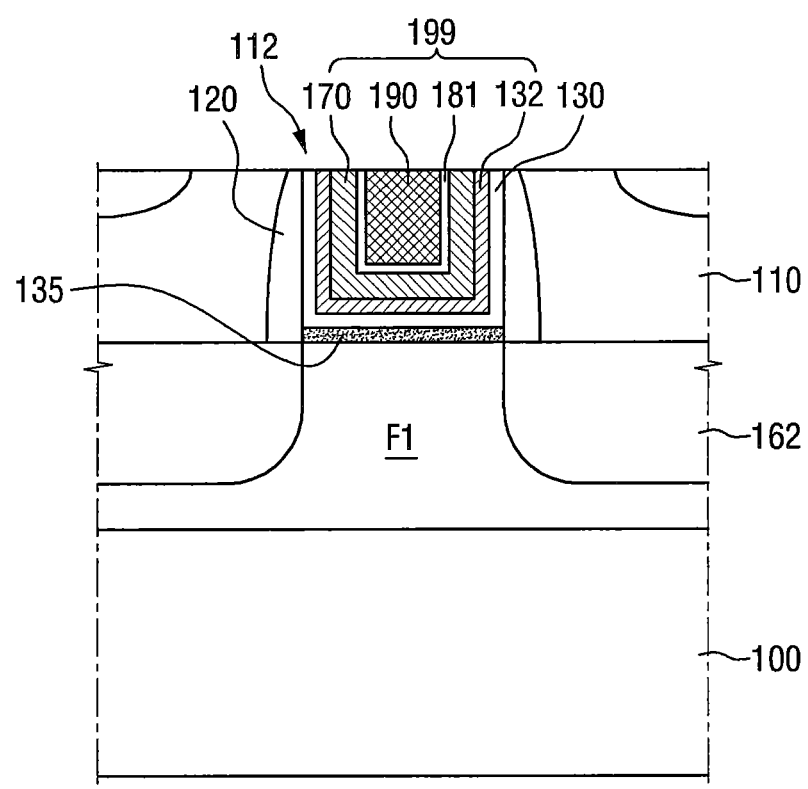
FIG. 2 is a cross-sectional view taken along the line A-A of FIG. 1.
Figure 3:
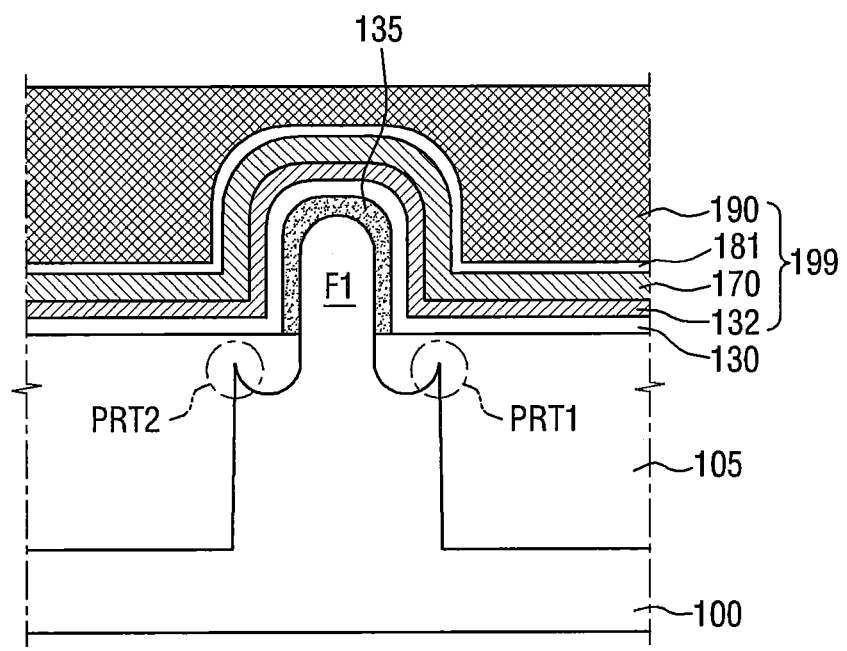
FIG. 3 is a cross-sectional view taken along the line B-B of FIG. 1.
Figure 4:
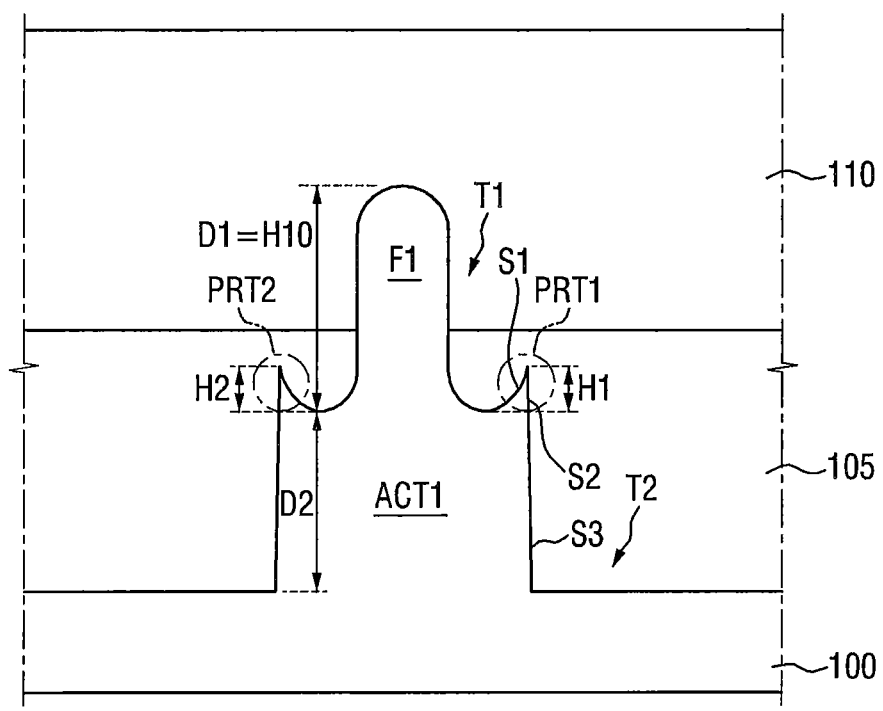
FIG. 4 is a cross-sectional view taken along the line C-C of FIG. 1.

FIG. 1 is a layout view illustrating a semiconductor device according to a first embodiment of the present inventive concept, FIG. 2 is a cross-sectional view taken along the line A-A of FIG. 1, FIG. 3 is a cross-sectional view taken along the line B-B of FIG. 1, and FIG. 4 is a cross-sectional view taken along the line C-C of FIG. 1.

The semiconductor device according to the first embodiment of the present inventive concept will now be described with regard to a case where it is an N-type fin transistor, but aspects of the present inventive concept are not limited thereto.

Referring first to FIGS. 1 to 3, the semiconductor device according to the first embodiment of the present inventive concept is formed in an active region ACT1 of a substrate 100. The substrate 100 may include one or more semiconductor material selected from the group consisting of Si, Ge, SiGe, GaP, GaAs, SiC, SiGeC, InAs and InP. Some embodiments provide that the substrate 100 may be, for example, a silicon on insulator (SOI) substrate.

A fin F1 may extend in a first direction X. The fin F1 may be a portion of the substrate 100 and may include an epitaxial layer grown from the substrate 100.

In FIG. 1, the fin F1 having a rectangular shape is illustrated, but aspects of the present inventive concept are not limited thereto. Corners of the fin F1 may be eroded to be slightly inclined, that is, the fin F1 may have a chamfered shape. In addition, when the fin F1 is rectangular, it may include long sides and short sides.

As shown in FIG. 1, a single fin F1 may be formed in the active region ACT1 (that is, a single fin structure). That is to say, the semiconductor device according to the first embodiment of the present inventive concept may be a fin type transistor using a single fin F1. Unlike in the illustrated embodiment, two or more fins F1 may be formed in the active region ACT1 (that is, a dual fin structure or a multi fin structure).

A metal gate 199 may be formed on the fin F1 so as to intersect the fin F1. That is to say, the metal gate 199 may extend in a second direction Y. The metal gate 199 may include a lower metal layer 132, an N type work function control layer 170, a wetting layer 181, and a gap fill layer 190. The metal gate 199 may be formed by a replacement process.

The interlayer insulation layer 110 may be formed on the substrate 100 and may include a trench 112. The interlayer insulation layer 110 may be formed by stacking two or more insulation layers. As shown, sidewalls of the trench 112 may make contact with a spacer 120 and a bottom surface of the trench 112 may make contact with the substrate 100.

The spacer 120 may include at least one of a nitride layer and an oxynitride layer.

An interface layer 135 may be formed in the trench 112. As shown, the interface layer 135 may be formed on a bottom surface of the trench 112 by an oxidation process. In addition, unlike in the illustrated embodiment, the interface layer 135 may be conformally formed along the sidewalls and bottom surface of the trench 112 by a deposition process. The deposition process may include, for example, chemical vapor deposition (CVD), and/or atomic layer deposition (ALD), but not limited thereto. The interface layer 135 may be a silicon oxide layer (e.g., HTO), but not limited thereto. The interface layer 135 may be formed to a thickness of, for example, about 50 Å or less (in a range of about 5 Å to about 50 Å). For example, the interface layer 135 may be formed to a thickness of 10 Å. The interface layer 135 may be used to improve operating characteristics (that is, to increase a breakdown voltage) of a high-voltage transistor.

A dielectric layer 130 may be formed on the interface layer 135 conformally along the sidewalls and bottom surface of the trench 112. The dielectric layer 130 and the interface layer 135 may be disposed to make contact with each other. The dielectric layer 130 may include a high-k material having a higher dielectric constant than silicon oxide. The dielectric layer 130 may include, for example, a material selected from the group consisting of $HfO_2$, $ZrO_2$, $Ta_2O_5$, $TiO_2$, $SrTiO_3$ and $(Ba,Sr)TiO_3$. The dielectric layer 130 may be formed to an appropriate thickness according to the kind of device to be formed. For example, when the dielectric layer 130 includes $HfO_2$, it may be formed to a thickness of about 50 Å or less (that is, in a range of about 5 Å to about 50 Å).

The lower metal layer 132 may be formed on the dielectric layer 130 conformally along the sidewalls and bottom surface of the trench 112. The lower metal layer 132 may include, for example, at least one of TiN and TaN. For example, the lower metal layer 132 may be a stacked layer of TiN and TaN. In this case, a TiN layer is formed to make contact with the dielectric layer 130 and a TaN layer may be formed on the TiN layer so as to make contact with the TiN layer. The TiN layer may protect the dielectric layer 130 and the TaN layer may be used as an etch stop layer when a portion of the N type work function control layer 170 is removed.

The N type work function control layer 170 may be formed on the lower metal layer 132 in the trench 112. As shown, the N type work function control layer 170 may also conformally formed along the sidewalls and bottom surface of the trench 112. The N type work function control layer 170 may control a work function of an N type transistor, thereby adjusting operating characteristics of the N type transistor. The N type work function control layer 170 may include a material selected from the group consisting of TiAl, TiAlC, TiAlN, TaC, TiC, and HfSi. For example, the N type work function control layer 170 may be a TiAlC.

The wetting layer 181 may be formed on the N type work function control layer 170 in the trench 112. The wetting layer 181 may include at least one of TiN and Ti. In some embodiments, the wetting layer 181 may include a TiN layer and a Ti layer sequentially stacked. For example, when the gap fill layer 190 includes aluminum (Al), the wetting layer 181 may be formed of a single layer of Ti or TiN. When the gap fill layer 190 includes tungsten (W), the wetting layer 181 may be formed of a single layer of TiN. The wetting layer 181 may be formed to a thickness in a range between about 10 Å and 100 Å (for example, 70 Å).

Meanwhile, referring to FIGS. 1 and 4, as described above, the fin F1 may be defined by a first trench T1 having a first depth D1, the active region ACT1 may be defined by a second depth (D1+D2) that is greater than the first depth D1. The first trench T1 may be a shallow trench and the second trench T2 may be a deep trench.

In some embodiments, the first trench T1 and the second trench T2 may be disposed to be directly adjacent one another. The phrase "directly adjacent" used herein may mean that another trench having a first depth (i.e., a shallow trench) does not intervene between the first trench T1 and the second trench T2.

A field insulation layer 105 is formed to fill a portion of the first trench T1 and a portion of the second trench T2.

Protrusion structures PRT1 and PRT2 may protrude from a bottom of the first trench T1 and may be formed to be lower than a surface of the field insulation layer 105. As shown, the protrusion structures PRT1 and PRT2 may be positioned at a boundary between the first trench T1 and the second trench T2.

Figure 14:
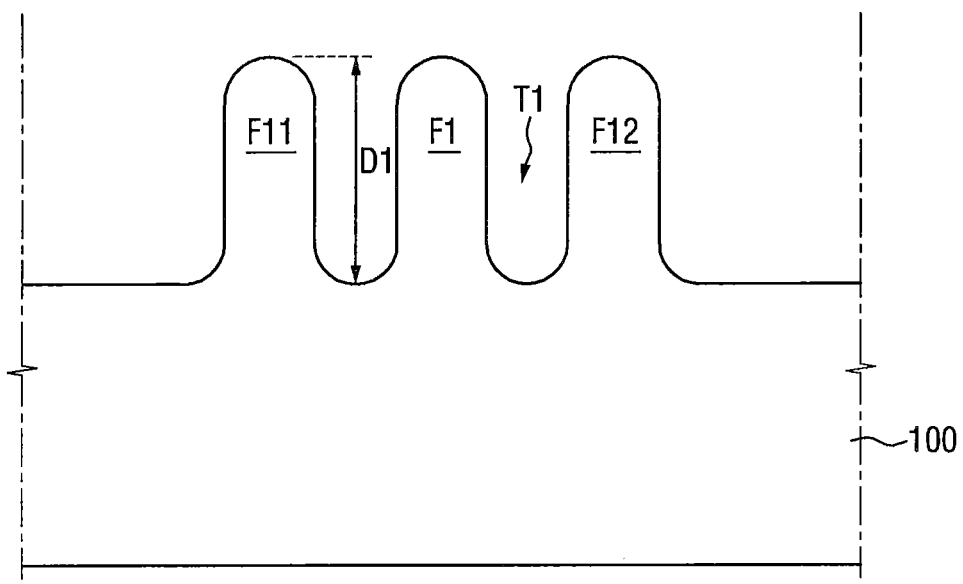
Figure 15:
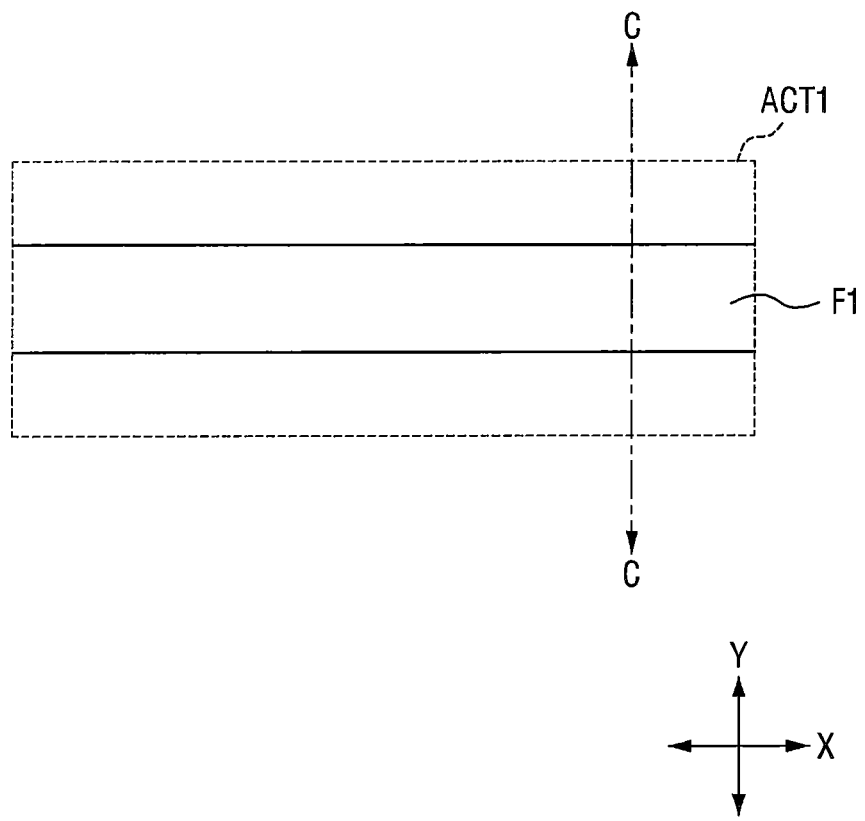
Figure 16:
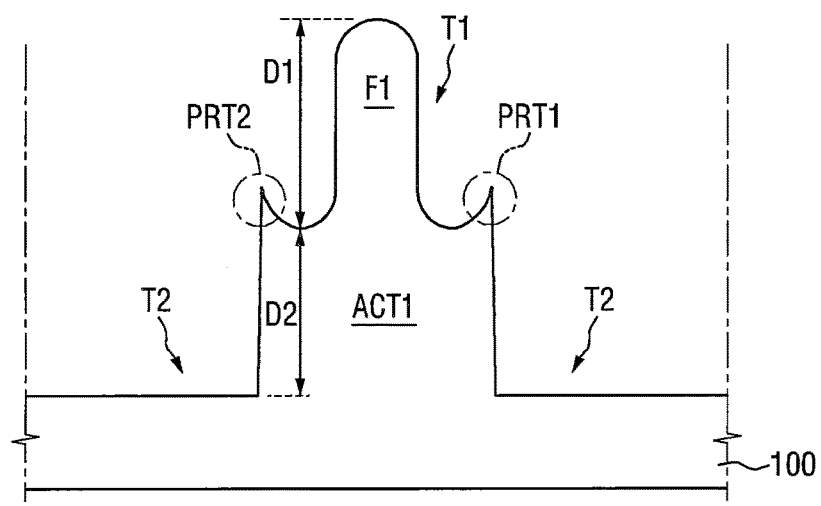

For example, after forming a plurality of fins by forming the first trench T1 having the first depth D1 (see FIGS. 13 and 14), the second trench T2 having the second depth (D1+D2) greater than the first depth D1 is formed, thereby defining the active region ACT1 (see FIGS. 15 and 16). Here, when the second trench T2 is formed, among the plurality of fins (e.g., 3 fins), only a target number of fins (e.g., one fin) are left. That is to say, when the second trench T2 is formed, among the plurality of fins (e.g., 3 fins), a number of fins (e.g., 2 fins) are removed. If a mask for forming the first trench T1 and a mask for forming the second trench T2 are misaligned, the number of fins (e.g., 2 fins) may not be completely removed when the second trench T2 is formed, but traces may remain. The traces may become the protrusion structures PRT1 and PRT2.

Here, if the protrusion structures PRT1 and PRT2 have considerably large sizes, the large sizes may cause failures in a subsequent process. However, in order to completely remove the protrusion structures PRT1 and PRT2, processing conditions may be quite strictly managed. In this case, however, a development burden may be unavoidably incurred. Therefore, the protrusion structures PRT1 and PRT2 may be managed so as to have appropriate sizes, thereby minimizing the development burden while increasing the yield. For example, the protrusion structures PRT1 and PRT2 may be managed such that their height H1 is smaller than a height H10 of the fin F1 and the protrusion structures PRT1 and PRT2 are lower than a surface of the field insulation layer 105. If tips of the protrusion structures PRT1 and PRT2 protrude higher than the surface of the field insulation layer 105, a processing failure (e.g., a short) may occur in a subsequent replacement process).

The protrusion structures PRT1 and PRT2 include a first inclined surface S1 disposed at a side of the first trench T1 and a second inclined surface S2 disposed at a side of the second trench T2. The first inclined surface S1 may have a first inclination angle and the second inclined surface S2 may have a second inclination angle that is different from the first inclination angle. As shown, the second inclined surface S2 having the second inclination angle may be steeper than the first inclined surface S1 having the first inclination angle. The first inclined surface S1 is connected to the first trench T1 and the second inclined surface S2 is connected to the second trench T2. The inclination angle of the second inclined surface S2 is equal to an inclination angle of a sidewall S3 of the second trench T2. That is to say, the second inclined surface S2 and the sidewall S3 of the second trench T2 may be disposed on the same line.

Meanwhile, the protrusion structures PRT1 and PRT2 may be disposed at opposite sides of the active region ACT1 in view of the fin F1. In addition, as shown, the first protrusion structure PRT1 and the second protrusion structure PRT2 may be symmetrically disposed with respect to each other in view of the fin F1.

In addition, the protrusion structures PRT1 and PRT2 may extend lengthwise in a direction (X) in which the fin F1 extends. In addition, as shown in FIGS. 1 and 3, the metal gate 199 may be formed to intersect the fin F1 and the protrusion structures PRT1 and PRT2.

Figure 5:
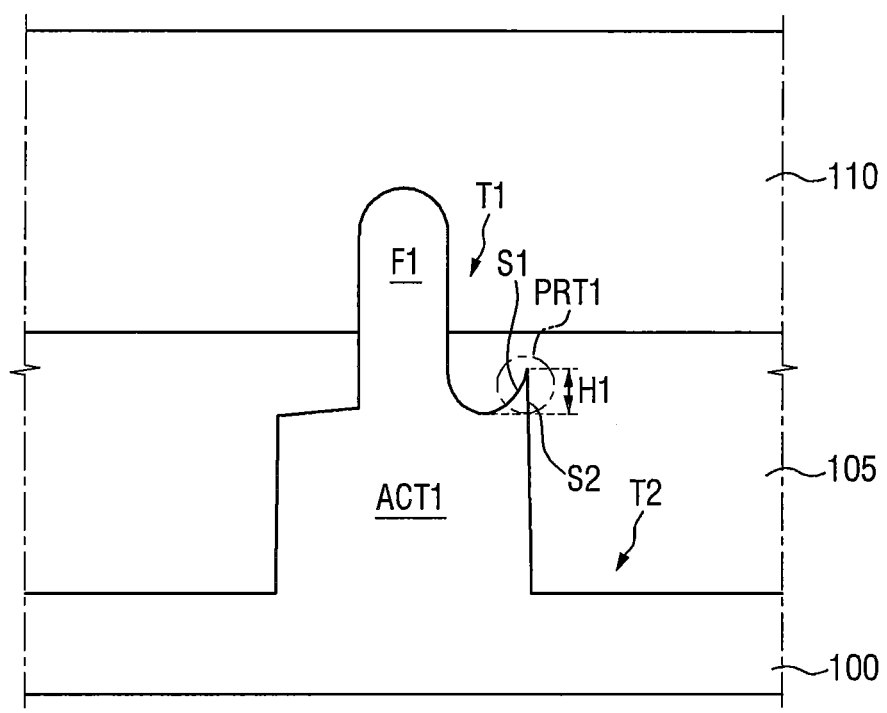
FIG. 5 is a cross-sectional view illustrating a semiconductor device according to a second embodiment of the present inventive concept.

FIG. 5 is a cross-sectional view illustrating a semiconductor device according to a second embodiment of the present inventive concept. For the sake of brevity and convenient explanation, the following description will focus on differences between the present embodiment and the previous embodiment shown in FIGS. 1 to 4.

Referring to FIG. 5, in the semiconductor device according to the second embodiment of the present inventive concept, a protrusion structure PRT1 may be disposed at only one side of the active region ACT1 in view of a fin F1.

Likewise, the protrusion structure PRT1 may have a height H1 and the height may be lower than a surface of a field insulation layer 105. The protrusion structure PRT1 includes a first inclined surface S1 disposed at a side of a first trench T1 and a second inclined surface S2 disposed at a side of a second trench T2. The first inclined surface S1 may have a first inclination angle and the second inclined surface S2 may have a second inclination angle different from the first inclination angle. As shown, the second inclined surface S2 having the second inclination angle may be steeper than the first inclined surface S1 having the first inclination angle. The first inclined surface S1 is connected to the first trench T1 and the second inclined surface S2 is connected to the second trench T2.

Figure 6:
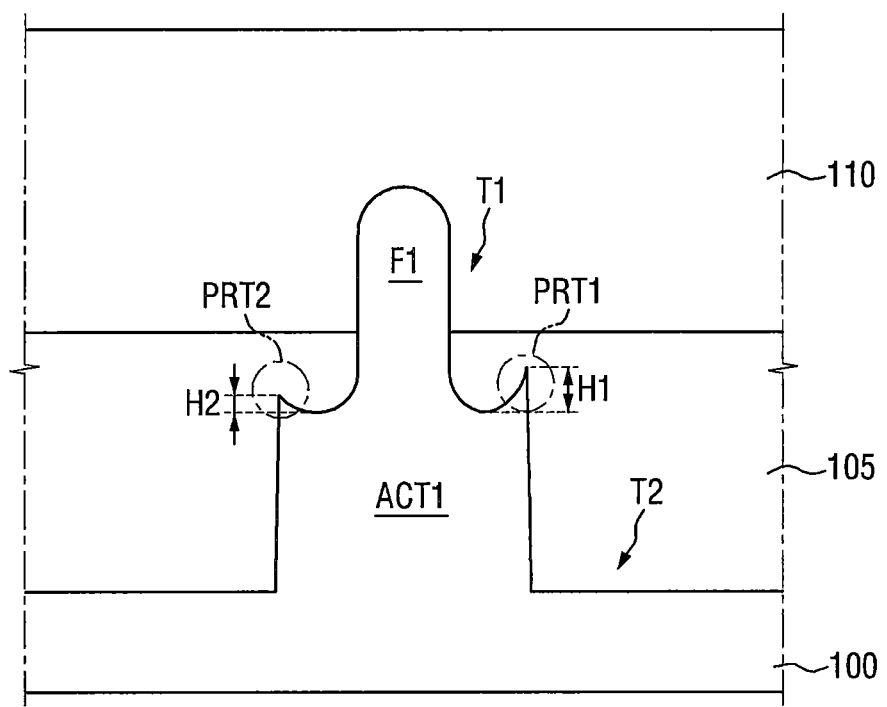
FIG. 6 is a cross-sectional view illustrating a semiconductor device according to a third embodiment of the present inventive concept.

FIG. 6 is a cross-sectional view illustrating a semiconductor device according to a third embodiment of the present inventive concept. For the sake of brevity and convenient explanation, the following description will focus on differences between the present embodiment and the previous embodiment shown in FIGS. 1 to 4.

Referring to FIG. 6, in the semiconductor device according to the third embodiment of the present inventive concept, protrusion structures PRT1 and PRT2 may be asymmetrically disposed with respect to each other in view of the fin F1.

The first protrusion structure PRT1 and the second protrusion structure PRT2 may have different sizes. That is to say, the height H1 of the protrusion structure PRT1 and the height H2 of the second protrusion structure PRT2 may be different from each other. As shown, the first protrusion structure PRT1 may be larger than the second protrusion structure PRT2 in size, and the height H1 of the first protrusion structure PRT1 may be greater than the height H2 of the second protrusion structure PRT2.

Figure 7:
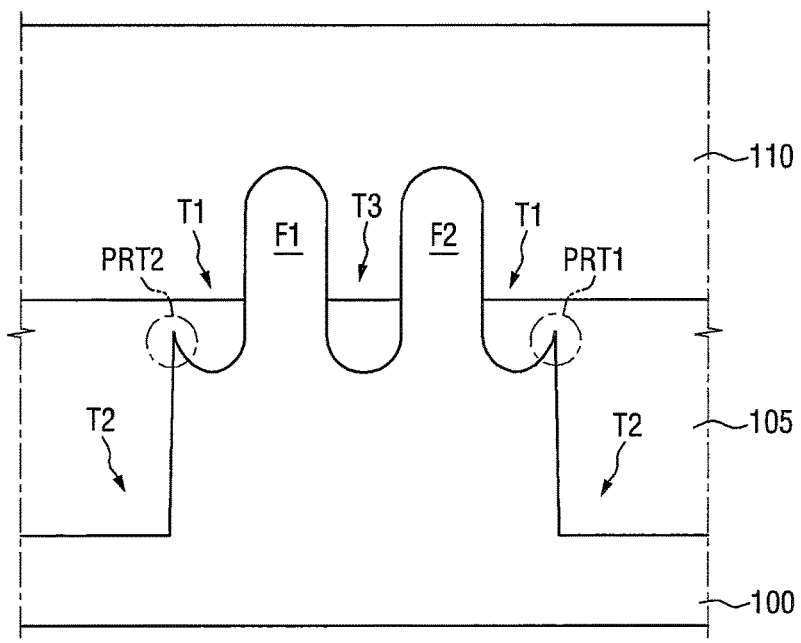
FIG. 7 is a cross-sectional view illustrating a semiconductor device according to a fourth embodiment of the present inventive concept.
Figure 8:
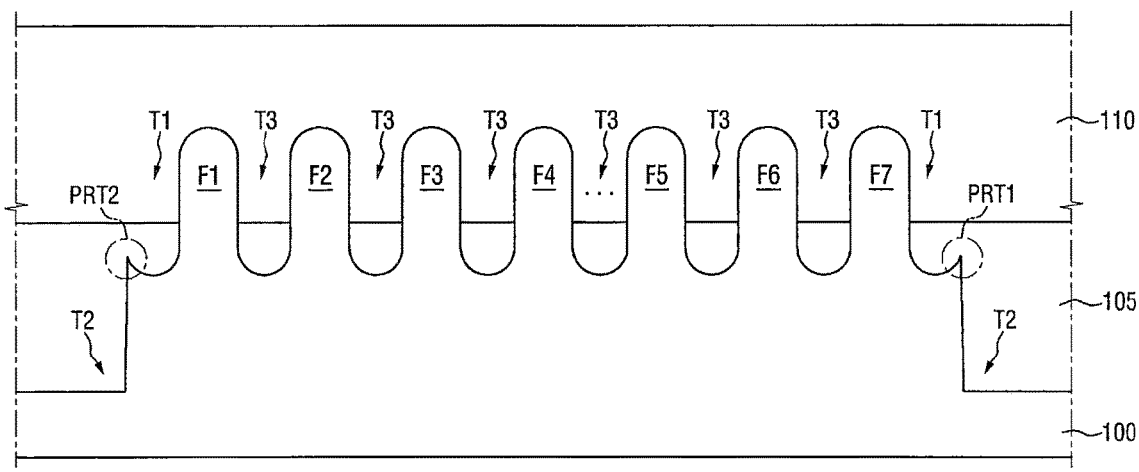
FIG. 8 is a cross-sectional view illustrating a semiconductor device according to a fifth embodiment of the present inventive concept.

FIGS. 7 and 8 are cross-sectional views illustrating semiconductor devices according to fourth and fifth embodiments of the present inventive concept. For the sake of brevity and convenient explanation, the following description will focus on differences between the present embodiment and the previous embodiment shown in FIGS. 1 to 4.

As shown in FIG. 7, the semiconductor device according to the fourth embodiment of the present inventive concept may be a fin type transistor using two fins F1 and F2 (i.e., a dual fin structure). That is to say, the two fins F1 and F2 may be formed in a first active region ACT1.

Here, a third trench T3 having a third depth may be disposed between the fin F1 and the fin F2. The third trench T3 may be formed at the same with the first trench T1. In addition, the third depth of the third trench T3 and the first depth of the first trench T1 may be equal to each other.

As shown in FIG. 8, the semiconductor device according to the fifth embodiment of the present inventive concept may be a fin type transistor using three or more fins F1 to F7 (i.e., a multi fin structure). That is to say, three or more fins F1 to F7 may be formed in a first active region ACT1.

As shown, a first protrusion structure PRT1 may be formed between a first trench T1 disposed at a side of a fin F7 (i.e., a fin disposed at one end) and a second trench T2 and a second protrusion structure PRT2 may be formed between the first trench T1 disposed at a side of a fin F1 (i.e., a fin disposed at the other end) and the second trench T2.

Here, third trench T3 each having a third depth may be disposed between each adjacent ones of the fins F1~F7. The third trenches T3 may be formed at the same time with the first trench T1. In addition, the third depth of the third trench T3 and the first depth of the first trench T1 may be equal to each other.

Figure 9:
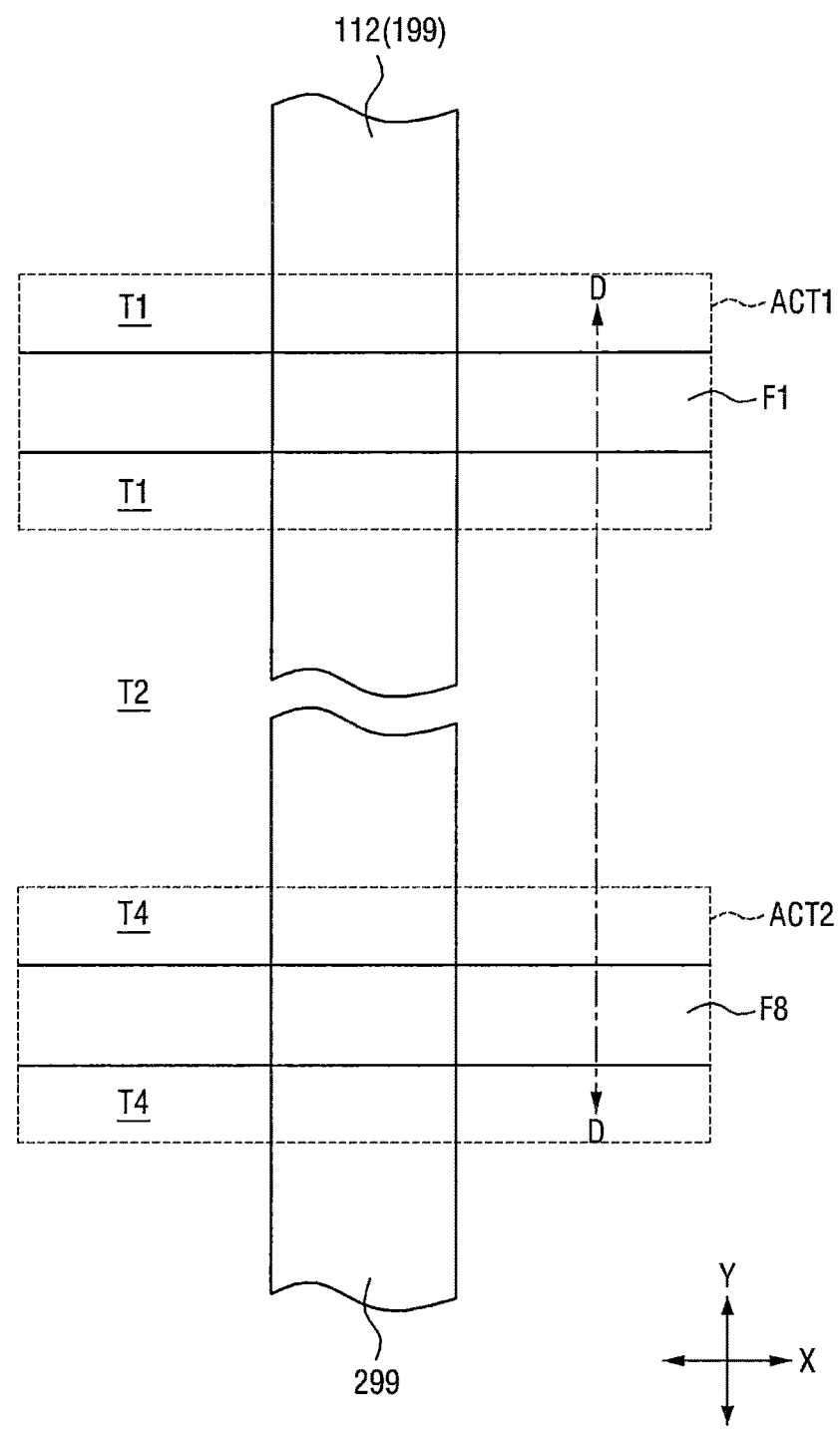
FIG. 9 is a cross-sectional view illustrating a semiconductor device according to a sixth embodiment of the present inventive concept.
Figure 10:
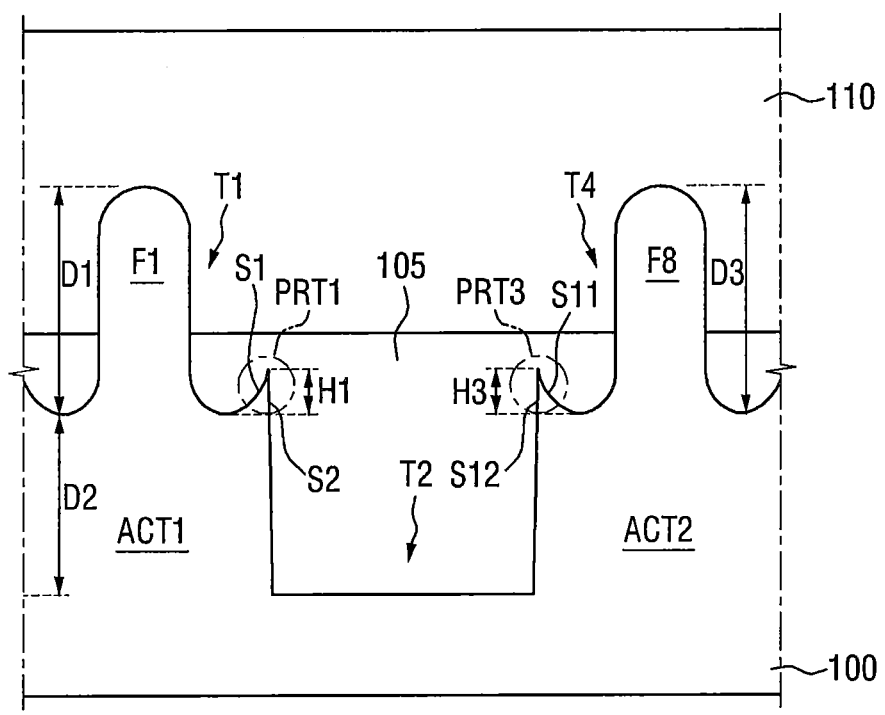
FIG. 10 is a cross-sectional view taken along the line D-D of FIG. 9.

FIG. 9 is a cross-sectional view illustrating a semiconductor device according to a sixth embodiment of the present inventive concept and FIG. 10 is a cross-sectional view taken along the line D-D of FIG. 9. For the sake of brevity and convenient explanation, the following description will focus on differences between the present embodiment and the previous embodiment shown in FIGS. 1 to 4.

Referring to FIGS. 9 and 10, the semiconductor device according to the sixth embodiment of the present inventive concept includes a first active region ACT1 and a second active region ACT2 separated from each other. A fin F1 is formed in the first active region ACT1 and a fin F8 is formed in the second active region ACT2.

The fins F1 and F8 may extend lengthwise in a first direction X. The fins F1 and F8 may be portions of a substrate 100 and may include epitaxial layers grown from the substrate 100.

Here, the fin F1 may be defined by a first trench T1 having a first depth D1 and the fin F8 may be defined by a fourth trench T4 having a third depth D3. The first trench T1 and the fourth trench T4 may be formed at the same time. In addition, the first depth D1 and the third depth D3 may be equal to each other.

Meanwhile, the first and second active regions ACT1 and ACT2 may be defined by a second trench T2 having a second depth (D1+D2) greater than the first depth D1 or the third depth D3.

As shown, one fin F1, F8 formed in the first, second active region ACT1, ACT2 is illustrated, but aspects of the present inventive concept are not limited thereto. That is to say, two or more fins may be formed in each of the active regions ACT1 and ACT2.

A metal gate 199 may be formed on the fin F1 so as to intersect the fin F1. The metal gate 199 may extend in a second direction Y. In addition, a metal gate 299 may be formed on the fin F2 so as to intersect the fin F2. The metal gate 299 may extend in the second direction Y.

The two metal gates 199 and 299 may be different gates or may be connected to each other.

A first protrusion structure PRT1 may protrude from a bottom surface of a first trench T1 and may be lower than the surface of the field insulation layer 105. The first protrusion structure PRT1 may be positioned at a boundary between the first trench T1 and the second trench T2.

The first protrusion structure PRT1 may include a first inclined surface S1 disposed at a side of the first trench T1 and a second inclined surface S2 disposed at a side of the second trench T2. The inclined surface S1 may have a first inclination angle and the inclined surface S2 may have a second inclination angle that is different from the first inclination angle. As shown, the inclined surface S1 has the first inclination angle and the inclined surface S2 has the second inclination angle.

In addition, a third protrusion structure PRT3 may protrude from a bottom surface of a fourth trench T4 and may be lower than the surface of the field insulation layer 105. The third protrusion structure PRT3 may be positioned at a boundary between the fourth trench T4 and the second trench T2.

The third protrusion structure PRT3 may include an inclined surface S11 disposed at a side of the fourth trench T4 and an inclined surface S12 disposed at a side of the second trench T2. The inclined surface S11 may have an eleventh inclination angle and the inclined surface S12 may have a twelfth inclination angle that is different from the eleventh inclination angle. As shown, the inclined surface S11 has an eleventh inclination angle and the inclined surface S12 having the twelfth inclination angle may be steeper than the inclined surface S11 having the eleventh inclination angle. Some embodiments provide that the first inclination angle and the second inclination angle may be steeper than the inclined surface S11 having the eleventh inclination angle.

As shown, the first protrusion structure PRT1 and the third protrusion structure PRT3 may be symmetrically disposed with respect to each other in view of the second trench T2. In addition, a height H1 of the protrusion structure PRT1 may be different from a height H3 of the third protrusion structure PRT3 may be equal to each other.

In addition, the fin F1 may extend lengthwise in a first direction X. The fin F1 may be shaped of a rectangle having long sides and short sides. Likewise, the fin F8 may extend lengthwise in the first direction X. The fin F8 may be shaped of a rectangle having long sides and short sides. The long sides of the fin F1 and the fin F8 may be disposed to face each other. The protrusion structures PRT1 and PRT3 may be lengthwise formed along the long sides of the fin F1 and the fin F8.

Figure 11:
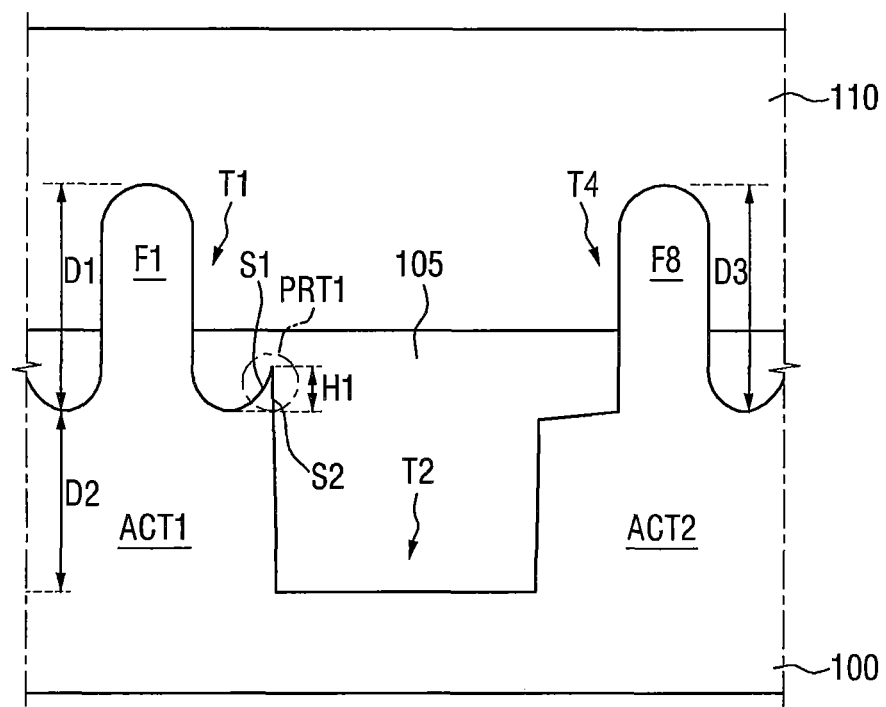
FIG. 11 is a cross-sectional view illustrating a semiconductor device according to a seventh embodiment of the present inventive concept.

FIG. 11 is a cross-sectional view illustrating a semiconductor device according to a seventh embodiment of the present inventive concept. For the sake of brevity and convenient explanation, the following description will focus on differences between the present embodiment and the previous embodiment shown in FIGS. 9 and 10.

Referring to FIG. 11, in the semiconductor device according to the seventh embodiment of the present inventive concept, a protrusion structure PRT1 may be disposed at only one side of a second trench T2. That is to say, the protrusion structure PRT1 may be positioned only at a boundary between a first trench T1 and the second trench T2 but may not be positioned at a boundary between the second trench T2 and a fourth trench T4.

Figure 12:
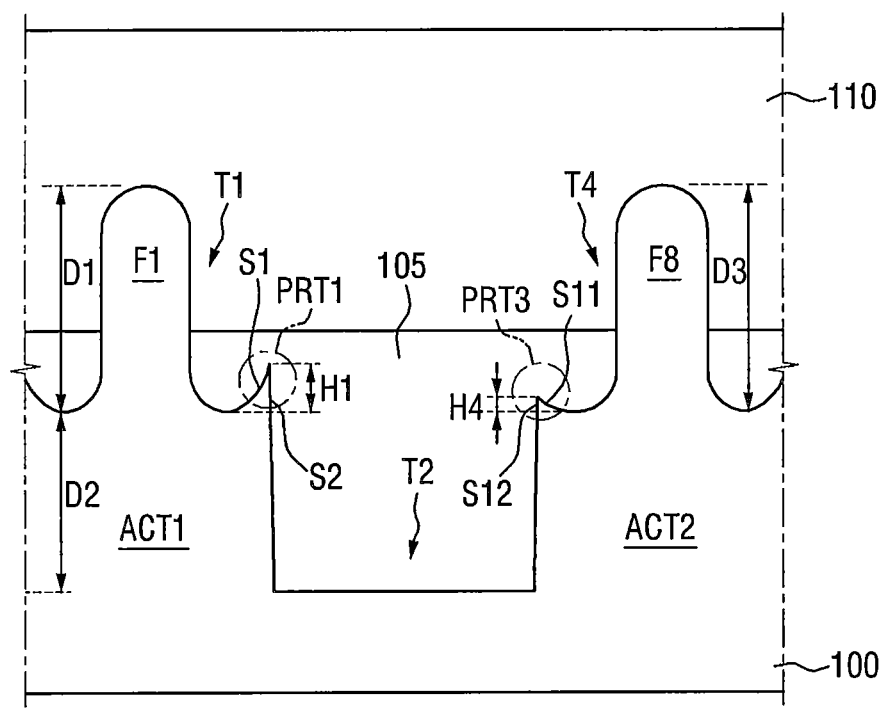
FIG. 12 is a cross-sectional view illustrating a semiconductor device according to an eighth embodiment of the present inventive concept.

FIG. 12 is a cross-sectional view illustrating a semiconductor device according to an eighth embodiment of the present inventive concept. For the sake of brevity and convenient explanation, the following description will focus on differences between the present embodiment and the previous embodiment shown in FIGS. 9 and 10.

Referring to FIG. 12, in the semiconductor device according to the eighth embodiment of the present inventive concept, the protrusion structures PRT1 and PRT3 may be disposed at opposite sides of a second trench T2. However, the protrusion structures PRT1 and PRT3 may be asymmetrically disposed with respect to each other in view of the second trench T2. In other words, the protrusion structures PRT1 and PRT3 may have different sizes. For example, a height H1 of the protrusion structure PRT1 and a height H4 of the protrusion structure PRT3 may be different from each other.

Hereinafter, a fabricating method for the semiconductor device according to the first embodiment of the present inventive concept will be described with reference to FIGS. 13 to 16 with FIGS. 1 to 4.

Figure 13:
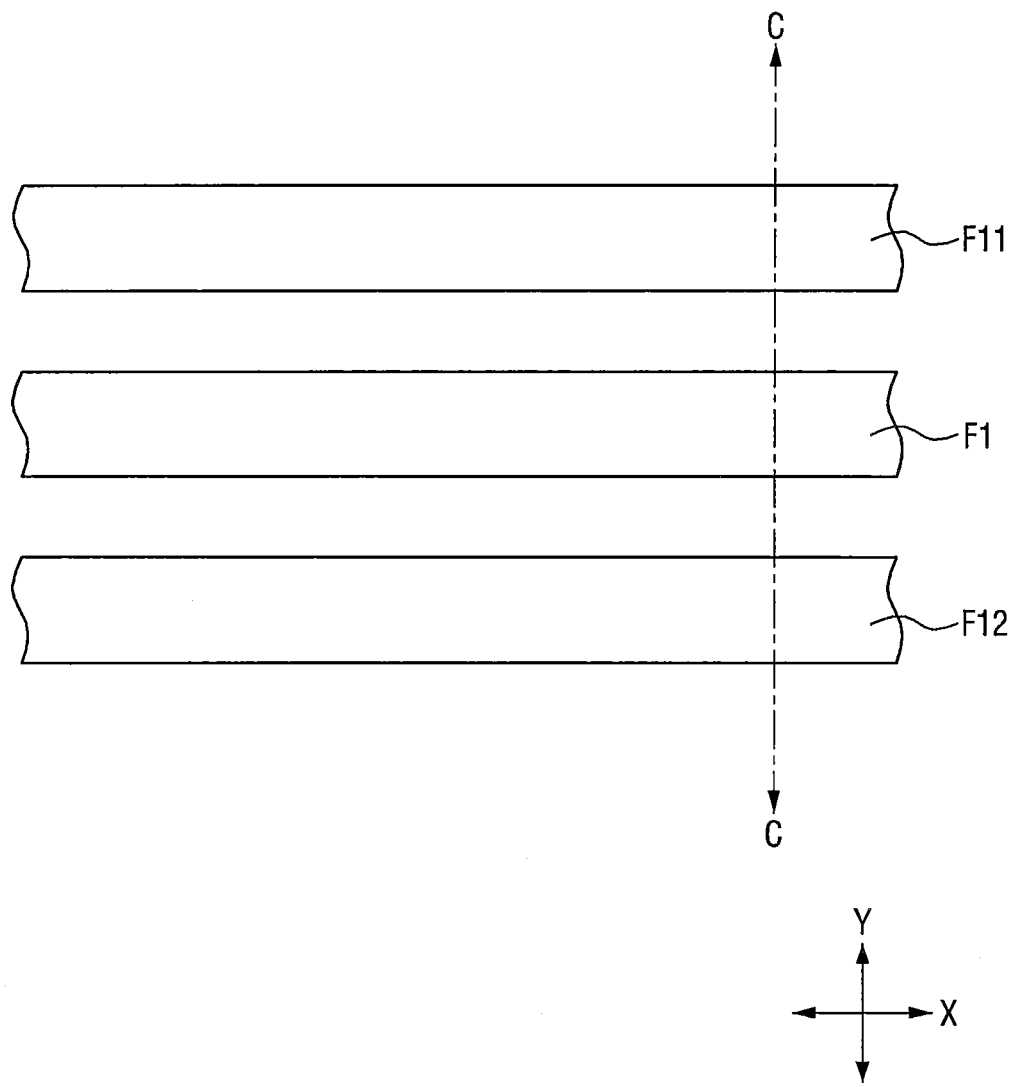
FIGS. 13 to 16 are diagrams illustrating intermediate process steps of a fabricating method for the semiconductor device according to the first embodiment of the present inventive concept.

FIGS. 13 and 15 are diagrams illustrating intermediate process steps of a fabricating method for the semiconductor device according to the first embodiment of the present inventive concept, and FIGS. 14 and 16 are cross-sectional views taken along the line C-C of FIGS. 13 and 15.

First, referring to FIGS. 13 and 14, a plurality of fins F1, F11 and F12 are formed on a substrate 100. The fins F1, F11 and F12 may extend lengthwise in a first direction X. A mask pattern is formed on the substrate 100 and a portion of the substrate 100 is etched using the mask pattern. That is to say, the plurality of fins F1, F11 and F12 are formed by forming a first trench T1 having a first depth D1 on the substrate 100. The fins F1, F11 and F12 may be disposed such that long sides thereof face each other.

Next, referring to FIGS. 15 and 16, a second trench T2 having a second depth (D1+D2) greater than the first depth D1 is formed to define an active region ACT1. Some fins F11 and F12 among the plurality of fins F1, F11 and F12 are removed by forming the second trench T2. That is to say, portions of the first trench T1 and the second trench T2 may overlap each other. In such a manner, protrusion structures PRT1 and PRT2 may be formed at a boundary between the first trench T1 and the second trench T2.

The protrusion structures PRT1 and PRT2 may have various shapes according to the extent of alignment between the first trench T1 and the second trench T2. That is to say, the protrusion structures PRT1 and PRT2 may be symmetrically disposed with respect to each other (see FIGS. 4 and 16). In some embodiments, the protrusion structure PRT1 may be formed only at one side of the active region ACT1 (see FIG. 5), or the protrusion structures PRT1 and PRT2 may be formed at opposite sides of the active region ACT1 to be symmetrical with respect to each other in view of the fin F1 (see FIG. 6).

Referring again to FIGS. 1 to 4, the metal gate 199 is formed to intersect the fin F1. In detail, a poly gate is formed to intersect the fin F1 and the interlayer insulation layer 110 is then formed to sufficiently cover the fin F1 and the poly gate. A polarization process is performed to expose a top surface of the poly gate. Next, the exposed poly gate is removed to form the trench 112. The dielectric layer 130 and the metal gate 199 are formed in the trench 112.

Those skilled in the art can fully analogize fabricating methods of the semiconductor devices according to the second to eighth embodiments based on the aforementioned fabricating method of the semiconductor devices according to the first embodiment of the present inventive concept.

Figure 17:
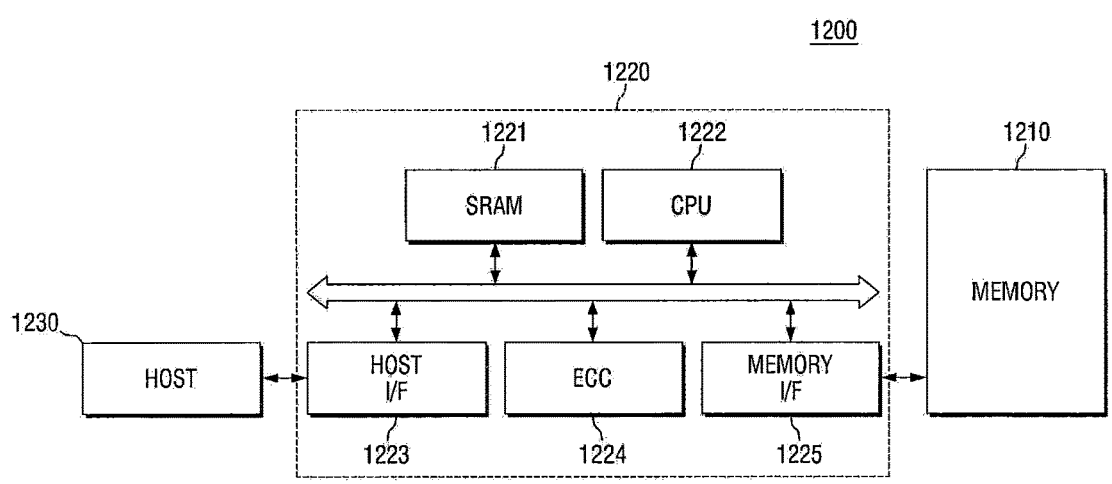
FIG. 17 is a block diagram of a memory card including semiconductor devices according to some embodiments of the present inventive concept.

FIG. 17 is a block diagram illustrating an example memory card including semiconductor devices according to some embodiments of the present inventive concept.

Referring to FIG. 17, a memory 1210 including semiconductor devices according to various embodiments of the present inventive concept can be employed to the memory card 1200. The memory card 1200 according to the present inventive concept includes a memory controller 1220 controlling data exchange between a host and the memory 1210.

A static random access memory (SRAM) 1221 is used as a working memory of a processing unit 1222. A host interface 1223 includes a data exchange protocol of the host 1230 connected to the memory card 1200. An error correction block 1224 detects and corrects an error included in data read from the memory 1210. A memory interface 1225 interfaces with the memory 1210 according to the present inventive concept. A central processing unit 1222 performs an overall controlling operation for data exchange of the memory controller 1220.

Figure 18:
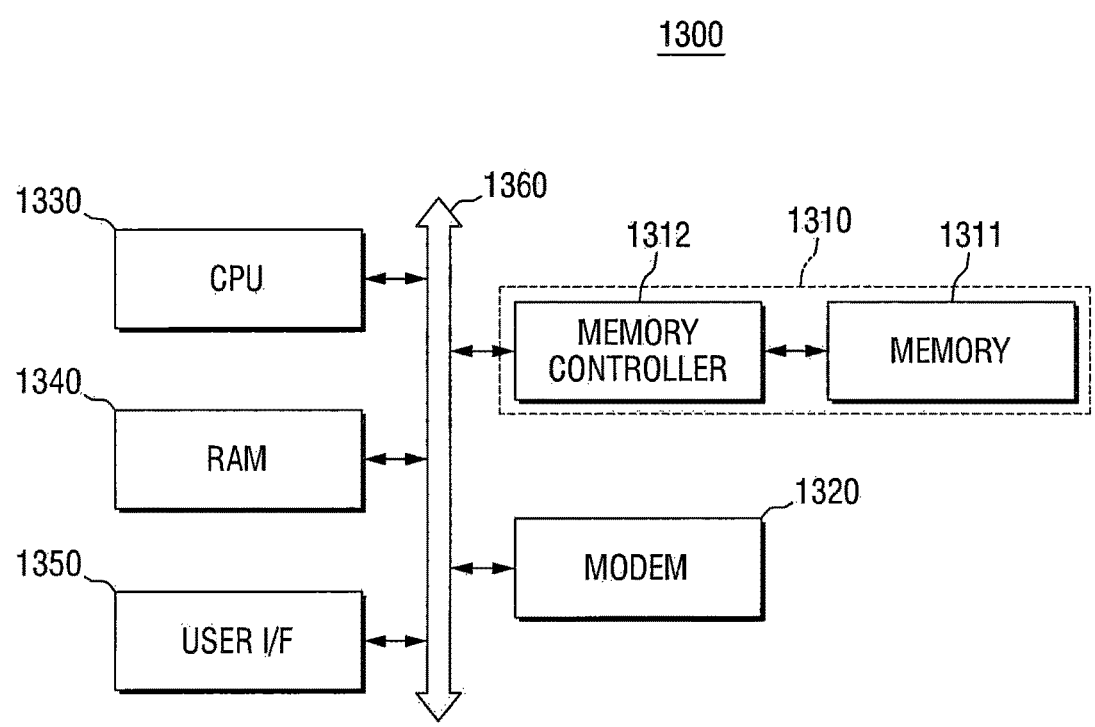
FIG. 18 is a block diagram of an information processing system including semiconductor devices according to some embodiments of the present inventive concept.

FIG. 18 is a block diagram illustrating an example information processing system having a semiconductor device according to some embodiments of the present inventive concept mounted therein.

Referring to FIG. 18, an information processing system 1300 may include a memory system 1310 including semiconductor devices according to various embodiments of the present inventive concept. The information processing system 1300 according to the present inventive concept includes a memory system 1310, a modem 1320, a central processing unit (CPU) 1330, a random access memory (RAM) 1340, and a user interface 1350, which are electrically connected to a system bus 1360, respectively. The memory system 1310 may include a memory 1311 and a memory controller 1312 and may have substantially the same configuration as the memory card 1200 shown in FIG. 12. The memory system 1310 may store data processed by the CPU 1330 and/or data received from an external device.

The information processing unit 1300 may be applied to a memory card, a solid state disk (SSD), a camera image processor (CIS) and other various an application chipsets. For example, the information processing unit 1300 may be configured to employ a solid state disk (SSD) and, in this case, it can stably process large-capacity data in a stable, reliable manner.

Figure 19:
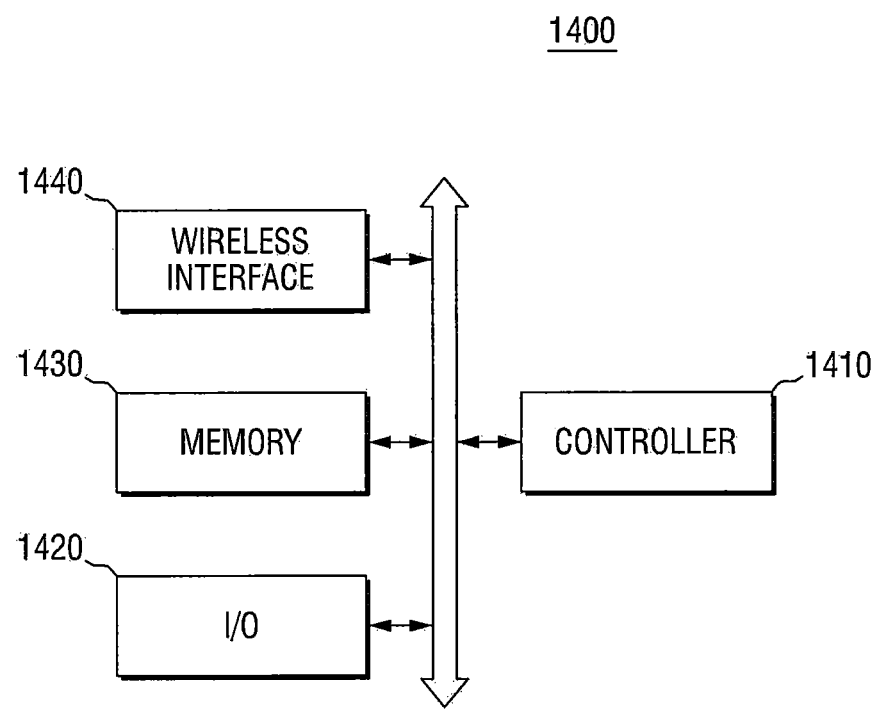
FIG. 19 is a block diagram of an electronic device including semiconductor devices according to some embodiments of the present inventive concept.

FIG. 19 is a block diagram of an electronic device including semiconductor devices according to some embodiments of the present inventive concept.

Referring to FIG. 19, the electronic device 1400 may include semiconductor devices according to some embodiments of the present inventive concept. The electronic device 1400 may be applied to a wireless communication device (for example, a personal digital assistant (PDA), a notebook computer, a portable computer, a web tablet, a wireless phone, and/or a wireless digital music player) or any type of electronic device capable of transmitting and/or receiving information in a wireless environment.

The electronic device 1400 may include a controller 1410, an input/output device (I/O) 1420, a memory 1430, and a wireless interface 1440. Here, the memory 1430 may include semiconductor devices according to various embodiments of the present inventive concept. The controller 1410 may include a microprocessor, a digital signal processor, and a processor capable of performing functions similar to these components. The memory 1430 may be used to store commands processed by the controller 1410 (or user data). The wireless interface 1440 may be used to exchange data through a wireless data network. The wireless interface 1440 may include an antenna and/or a wired/wireless transceiver. For example, the electronic device 1400 may use a third generation communication system protocol, such as CDMA, GSM, NADC, E-TDMA, WCDMA, CDMA2000, or the like.

While the present inventive concept has been particularly shown and described with reference to example embodiments thereof, it will be understood by those of ordinary skill in the art that various changes in form and details may be made therein without departing from the spirit and scope of the present inventive concept as defined by the following claims. It is therefore desired that the present embodiments be considered in all respects as illustrative and not restrictive, reference being made to the appended claims rather than the foregoing description to indicate the scope of the inventive concept.

What is claimed is:

1. A semiconductor device comprising:
   a first trench having a first depth in a vertical direction that defines a fin;
   a second trench that is directly adjacent the first trench and that has a second depth that is greater than the first depth;
   a field insulation layer that fills a portion of the first trench and a portion of the second trench; and
   a protrusion structure that protrudes from a bottom of the first trench and that is lower than a surface of the field insulation layer,
   wherein the protrusion structure is positioned at a boundary between the first trench and the second trench,
   wherein the protrusion structure has a first surface that is at a side of the first trench and a second surface that is at a side of the second trench, and
   wherein the first surface has a first inclination angle and the second surface has a second inclination angle that is different from the first inclination angle.

2. The semiconductor device of claim 1, wherein the fin extends lengthwise in a first direction and the protrusion structure extends lengthwise in the first direction.

3. The semiconductor device of claim 1, wherein the second trench defines an active region.

4. The semiconductor device of claim 3, wherein the protrusion structure comprises a first protrusion structure,
   wherein the semiconductor device further comprises a second protrusion structure, and
   wherein the first protrusion structure is on a first side of the active region relative to the fin and the second protrusion structure is at an opposing second side of the active region relative to the fin.

5. The semiconductor device of claim 4, wherein the first protrusion structure and the second protrusion structure have different heights.

6. The semiconductor device of claim 1, further comprising a gate that intersects the fin and the protrusion structure.

7. A semiconductor device comprising:
   a protrusion structure that has a first surface and a second surface;
   a first trench that is connected to the first surface and that defines a fin; and
   a second trench that is connected to the second surface,
   wherein an inclination angle of a sidewall of the second trench is equal to an inclination angle of the second surface and a height of the protrusion structure is smaller than a height of the fin.

8. The semiconductor device of claim 7, wherein the inclination angle of the second surface is greater than an inclination angle of the first surface.

9. The semiconductor device of claim 7, wherein the fin extends lengthwise in a first direction and the protrusion structure extends lengthwise in the first direction.

10. The semiconductor device of claim 7, further comprising a gate that intersects the fin and the protrusion structure.

11. A semiconductor device comprising:
- an active region that extends in a first direction and is defined on opposing sides by a first trench and a second trench, wherein the first and second trenches extend in the first direction and have a first depth;
- a fin in the active region that extends in the first direction and that is defined by a third trench and a fourth trench, wherein the third and fourth trenches extend in the first direction and have a second depth that is less than the first depth;
- a first protrusion structure that protrudes from a bottom of the third trench; and
- a second protrusion structure that protrudes from a bottom of the fourth trench,
- wherein the first protrusion structure has a first surface at a side of the first trench and a second surface at a side of the third trench, and
- wherein the first surface has a first inclination angle and the second surface has a second inclination angle that is different from the first inclination angle.

12. The semiconductor device of claim 11, further comprising a field insulation layer that fills a portion of the first trench, a portion of the second trench, a portion of the third trench and a portion of the fourth trench.

13. The semiconductor device of claim 11, wherein the first protrusion structure has a first height and the second protrusion structure has a second height that is different from the first height.

14. The semiconductor device of claim 11, wherein the first protrusion structure and the second protrusion structure have a same height.

15. The semiconductor device of claim 11, wherein the first and second protrusion structures are asymmetrical relative to one another.

16. The semiconductor device of claim 12, wherein the first and second protrusion structures are lower than a surface of the field insulation layer.

17. The semiconductor device of claim 11, wherein the first protrusion structure is positioned at a boundary between the first trench and the third trench,
- wherein the second protrusion structure is at a boundary between the second trench and the fourth trench.

* * * * *